(12) United States Patent
Mizushiri

(10) Patent No.: US 10,297,530 B2
(45) Date of Patent: May 21, 2019

(54) PRESS MEMBER FOR SEMICONDUCTOR STACK UNIT

(71) Applicant: DENSO CORPORATION, Kariya, Aichi-pref. (JP)

(72) Inventor: Keisuke Mizushiri, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/007,141

(22) Filed: Jun. 13, 2018

(65) Prior Publication Data

US 2018/0366390 A1   Dec. 20, 2018

(30) Foreign Application Priority Data

Jun. 14, 2017  (JP) .................................. 2017-117100

(51) Int. Cl.
*H01L 23/46* (2006.01)
*H01L 23/433* (2006.01)
*H01L 23/427* (2006.01)
*H01L 25/00* (2006.01)

(52) U.S. Cl.
CPC .......... *H01L 23/433* (2013.01); *H01L 23/427* (2013.01); *H01L 25/00* (2013.01)

(58) Field of Classification Search
CPC . H01L 2224/16145; H01L 2224/32145; H01L 23/46; H01L 23/473; H01L 25/0657
USPC ................................ 257/714, 723, 726, 727
See application file for complete search history.

(56) References Cited

U.S. PATENT DOCUMENTS

| | | | | |
|---|---|---|---|---|
| 6,297,549 B1 * | 10/2001 | Hiyoshi | ................ | H01L 25/072 257/502 |
| 2013/0003301 A1 * | 1/2013 | Miyamoto | ............ | H01L 23/473 361/699 |
| 2016/0086873 A1 * | 3/2016 | Sano | ..................... | H01L 23/473 257/714 |
| 2017/0301610 A1 * | 10/2017 | Tomita | .................... | F28F 3/086 |
| 2018/0070480 A1 * | 3/2018 | Hirasawa | .............. | B60L 15/007 |

FOREIGN PATENT DOCUMENTS

JP     2016-029693 A     3/2016

* cited by examiner

*Primary Examiner* — S. V. Clark
(74) *Attorney, Agent, or Firm* — Oliff PLC

(57) ABSTRACT

A press member which has a given length for pressing a semiconductor stack unit. The press member includes supported portions with which supporting members are placed in contact and which are arranged in a lengthwise direction of the press member, a spring which is curved in a convex shape and bulges away from contacts of the supporting members with the supported portions, and load-exerted portions which are arranged outside the supported portions in the lengthwise direction of the press member and capable of being subjected to mechanical load to elastically deform the spring, thereby shifting the supported portions. At least one of the load-exerted portions has a cut-out formed by cutting away a portion of the plate, thereby avoiding a physical interference of the press member with peripheral members and ensuring a desired degree of stroke and durability of the press member.

7 Claims, 11 Drawing Sheets

PRESS MEMBER FOR SEMICONDUCTOR STACK UNIT

CROSS REFERENCE TO RELATED DOCUMENT

The present application claims the benefit of priority of Japanese Patent Application No. 2017-117100 filed on Jun. 14, 2017, the disclosure of which is incorporated herein by reference.

BACKGROUND

1 Technical Field

This disclosure relates generally to a press member for a semiconductor stack unit.

2 Background Art

Japanese Patent First Publication No. 2016-29693 discloses an electrical power converter equipped with a semiconductor stack unit made of a stack of semiconductor modules and cooling pipes through which cooling medium flows to cool the semiconductor modules. The electrical power converter also includes a leaf spring serving to mechanically press the semiconductor stack unit in a direction in which the semiconductor modules and the cooling pipes are stacked (which will be referred to below as a stacking direction).

The above type of electrical power converters may be equipped with a maintenance cooling medium flow pipe, a cooling medium inlet pipe, or a cooling medium outlet pipe which is installed in an end of the semiconductor stack unit on which the press member is arranged. This structure is required to decrease the size of the press member in order to avoid mechanical interference of the press member with the above pipe. Such a decrease in size, however, results in a decrease in elastic deformation or stroke of the leaf spring, which leads to an insufficient spring pressure to press the semiconductor stack unit. If the configuration of an elastically deformable portion of the press member is changed with the decrease in size thereof, it may result in a decrease in durability of the press member.

SUMMARY

It is therefore an object of this disclosure to provide a press member for a semiconductor stack unit which is designed to avoid a mechanical interference with peripheral parts without sacrificing a required amount of elastic stroke and durability thereof.

According to one aspect of the disclosure, there is provided a press member which is made of a plate having a given length for pressing a semiconductor stack unit in which a plurality of semiconductor modules and a plurality of cooling medium flow paths are stacked in a stacking direction. The cooling medium flow paths serve to cool the semiconductor modules. The press member comprises: (a) a pair of supported portions with which supporting members are placed in contact and which are arranged in a lengthwise direction of the plate; (b) a spring which is curved in a convex shape and bulges away from contacts of the supporting members with the supported portions, the spring being in contact with a first end that is one of ends of the semiconductor stack unit opposed to each other in the stacking direction; and (c) a pair of load-exerted portions which are arranged outside the supported portions in the lengthwise direction of the plate and capable of being subjected to mechanical load to elastically deform the spring, thereby shifting the supported portions. At least one of the load-exerted portions has a cut-out formed by cutting away a portion of the plate.

The press member is designed to have the load-exerted portions located outside the supported portions in the lengthwise direction of the press member. At least one of the load-exerted portions has the cut-out formed therein. The physical interference of the press member with a peripheral member which is arranged on or in the first end of the semiconductor stack unit on which the press member is mounted is, therefore, avoided by placing the peripheral member within the cut-out. The load-exerted portions are subjected to mechanical load to elastically deform the spring when the press member is mounted on the semiconductor stack unit, after which the load is released from the load-exerted portions, thus eliminating the need for the load-exerted portions to have a higher degree of durability than the spring and the supported portions on which the pressure is always exerted. This enables the load-exerted portion to have the cut-out without experiencing an excessive reduction in durability. It is, thus, possible to avoid the physical interference between the press member and the peripheral member without sacrificing a required elastic deformation or stroke and durability of the press member.

The press member is, therefore, capable of eliminating the physical interference with the peripheral member and achieving a required amount of elastic stroke and durability thereof.

BRIEF DESCRIPTION OF THE DRAWINGS

The present invention will be understood more fully from the detailed description given hereinbelow and from the accompanying drawings of the preferred embodiments of the invention, which, however, should not be taken to limit the invention to the specific embodiments but are for the purpose of explanation and understanding only.

In the drawings.

DESCRIPTION OF THE PREFERRED EMBODIMENTS

First Embodiment

Figure 1:
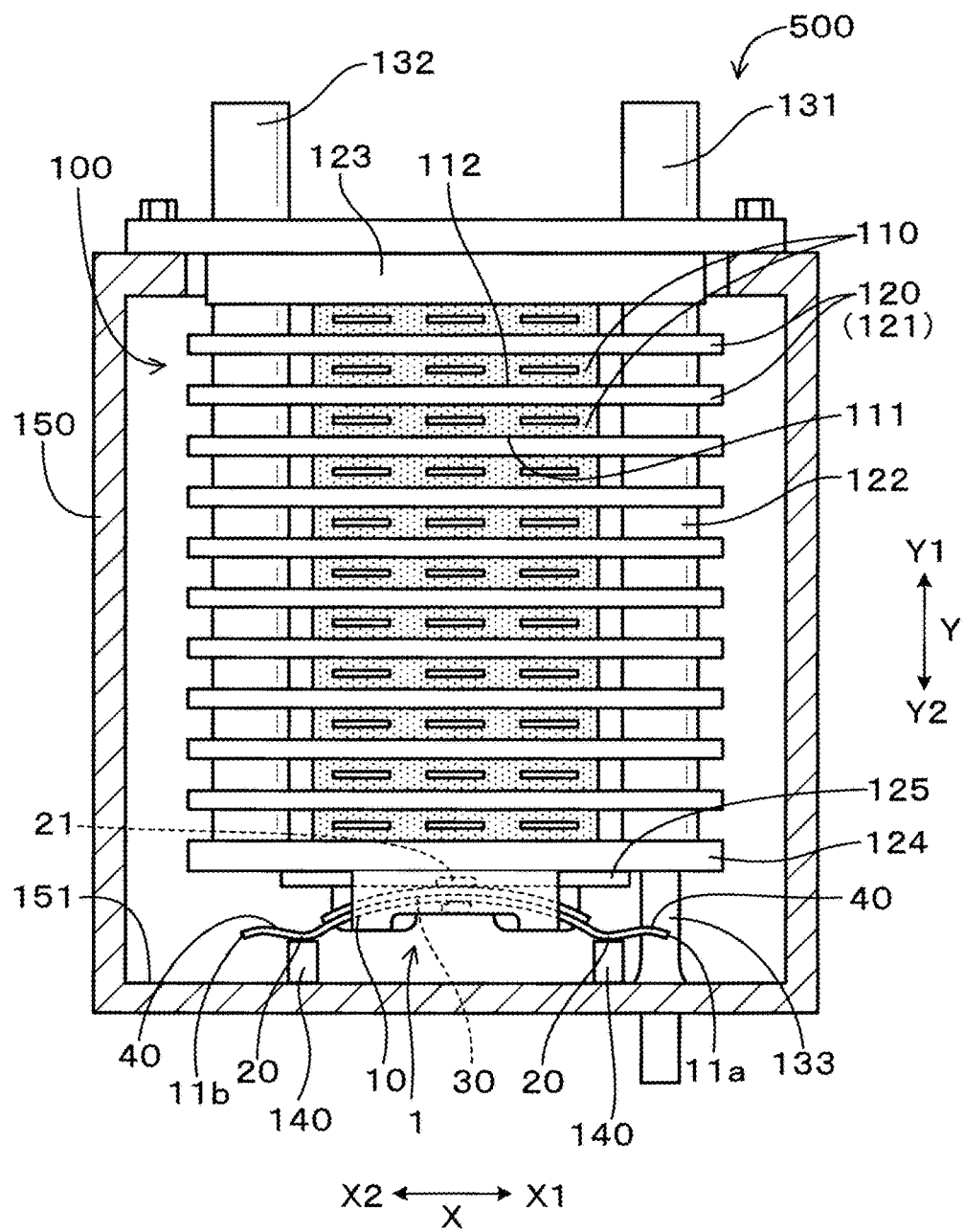
FIG. 1 is a schematic view which illustrates an electrical power conversion device according to the first embodiment.

Referring now to the drawings, particularly to FIGS. 1 to 5, the press member 1 is provided according to the first embodiment.

The press member 1 is, as clearly illustrated in FIG. 1, implemented by the elongated plate 10 and works to press the semiconductor stack unit 100 in a stacking direction Y. The plate 10 is made of an elongated member or a strip having a given length. The semiconductor stack unit 100 is made of a stack of a plurality of semiconductor modules 110 and a plurality of cooling medium flow paths 120. The stacking direction Y, as referred to herein, is a direction in which the semiconductor modules 110 and the cooling medium flow paths 120 are stacked on each other.

The press member 1 includes a pair of supported portions 20, a spring 30, and a pair of load-exerted portions 40.

The supported portions 20 are shaped to achieve physical contact with the supporting members 140 and arranged or aligned with each other in a lengthwise direction X of the plate 10.

The spring 30 is curved in a convex shape between the supported portions 20 and bulges away from the contacts of the supported portions 20 with the supporting members 140, so that the spring 30 physically contacts the end 125 of the semiconductor stack unit 100 in the stacking direction Y.

The load-exerted portions 40 are located more outwardly than the supported portions 20 in the length-wise direction X of the plate 10. The load-exerted portions 40 are shaped to enable physical or mechanical loads to be applied thereto to elastically deform the spring 30, thereby causing the supported portions 20 to be shifted or moved in the stacking direction Y.

Figure 2:
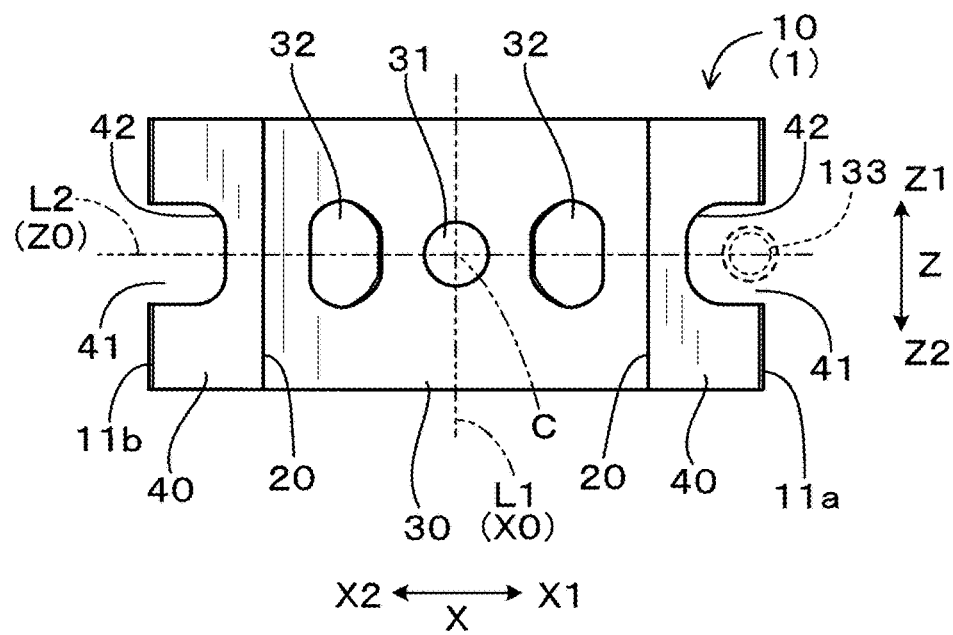
FIG. 2 is a plan view of a press member used in the electrical power conversion device of FIG. 1.

Each of the load-exerted portions 40, as illustrated in FIG. 2, has the cut-out 41 formed by cutting a portion of the plate 10. At least one of the load-exerted portions 40 may have the cut-out 41 formed therein.

The press member 1 for the semiconductor stack unit 100 in this embodiment will be described below in detail.

The press member 1, as illustrated in FIG. 1, works to press the semiconductor stack unit 100 in the stacking direction Y. The semiconductor stack unit 100 is mounted within the casing 150 to constitute the electrical power conversion device 500. The semiconductor stack unit 100 has a plurality of cooling medium pipes 121 laid at a given interval away from each other in the stacking direction Y. Each of the cooling medium pipes 121 is of a flattened shape and has the cooling medium flow paths 120 formed therein. The connecting pipe 122 is disposed between two of the cooling medium pipes 121 arranged adjacent each other in the stacking direction Y and communicates between the adjacent cooling medium flow paths 120. The connecting pipes 122 are deformable in the stacking direction Y.

The semiconductor stack unit 100 includes the cooling pipes 123 and 124 which are located at ends thereof which are opposed to each other in the stacking direction Y. In the following discussion, an upward direction, as viewed in FIG. 1, will also be referred to as a first direction Y1, and a downward direction opposite the first direction Y1 will also be referred to as a second direction Y2. The cooling pipe 123 is located at the outermost end of the semiconductor stack unit 100 in the first direction Y1 and connects with the cooling medium inlet pipe 131 into which the cooling medium is delivered and the cooling medium outlet pipe 13 from which the cooling medium is discharged. The cooling pipe 124 is located at the outermost end of the semiconductor stack unit 100 in the second direction Y2 and connects with the maintenance pipe 133. When it is required to maintain the semiconductor stack unit 100, the maintenance pipe 133 is used to discharge or deliver the cooling medium from or into the cooling medium flow paths 120. The maintenance pipe 133 is installed in an end of the cooling pipe 124 in the width-wise direction, in other words, the lengthwise direction X of the plate 10. In the following discussion, a rightward direction, as viewed in FIG. 1, will also be referred to a direction X1, and a leftward direction opposite the direction X1 will also be referred to as a direction X2 below. The maintenance pipe 133 extends in the second direction Y2.

Each of the semiconductor modules 110 is, as illustrated in FIG. 1, disposed between the adjacent cooling medium pipes 121. In other words, the semiconductor modules 110 and the cooling medium pipes 121 are alternately stacked on each other in the stacking direction Y. Each of the semiconductor modules 110 is of a flat plate shape having a given thickness and has the major surfaces 111 and 112 opposed to each other through the thickness thereof. The major surfaces 111 and 112 are placed in contact with the adjacent cooling medium pipes 121.

The press member 1 is, as clearly illustrated in FIG. 1, arranged outside the stack of the semiconductor modules 110 and the cooling medium pipes 121 in the second direction Y2. The press member 1 is, as clearly illustrated in FIG. 3, made up of the plate 10 and the auxiliary plate 15. The plate 10 and the auxiliary plate 15 are laid to overlap each other. The press member 1 is borne or retained by the supporting members 140. The plate 10 has the two supported portions 20 with which the supporting members 140 contact. The supported portions 20 are, as clearly illustrated in FIG. 2, aligned with each other in the lengthwise direction X and each extend to have a length in the width-wise direction Z perpendicular to the lengthwise direction X. Each of the supported portions 20 is, as can be seen in FIG. 1, curved in a convex shape toward the supporting members 140, in other words, bulges in the direction Y2.

Figure 3:
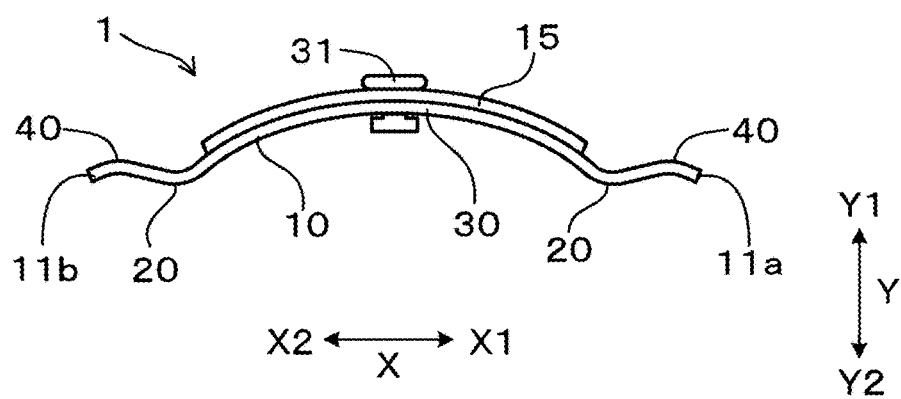
FIG. 3 is a side view of the press member in FIG. 2.

The plate 10, as clearly illustrated in FIGS. 1, 2, and 3, has the spring 30 interposed between the supported portions 20. The spring 30 is, as illustrated in FIG. 1, curved to bulge in a convex shape in the direction Y1 away from the supported portions 20 with which the supporting members 140 contact. The curved spring 30 has an apex on which the contacting portion 31 is formed. The contacting portion 31 contacts the pressure-exerted plate 125 which forms the end of the semiconductor stack unit 100 in the stacking direction Y. The contacting portion 31 in this embodiment is, as can be seen in FIG. 3, made of a member passing through the thickness of a combination of the plate 10 and the auxiliary plate 15 laid on each other. The contacting portion 31 is fit in a recess, not shown, formed in the surface of the pressure-exerted plate 125.

The spring 30, as illustrated in FIG. 2, has a pair of stress concentration reducers 32 formed therein. The stress concentration reducers 32 are made by cutting portions of the plate 10. For instance, the press member 1 shown in FIG. 4(b) which is not equipped with the stress concentration reducers 32 has a higher stress region which occupies a central area of the length of the press member 1 including the contacting portion 31, while the press member 1 of this embodiment shown in FIG. 4(a) has a higher stress region which is widely extended by the stress concentration reducers 32 as compared with the structure of FIG. 4(b), thereby alleviating or reducing the concentration of stress on the spring 30.

The stress concentration reducers 32 are, as illustrated in FIGS. 1 to 3, located outside the supported portions 20 in the lengthwise direction of the plate 10. In this disclosure, "outside the supported portions 20 in the lengthwise direction" means both "outside one of the supported portions 20 which is closer to the end of the length of the plate 10 facing the direction X1 and "outside the other supported portion 20 which is closer to the end of the length of the plate 10 facing the direction X2. "inside the supported portions 20 in the lengthwise direction" means "closer to the contacting portion 31 than the supported portions 20 are".

Each of the load-exerted portions 40 is, as clearly illustrated in FIG. 1, slightly curved or bulges in a convex shape toward the semiconductor stack unit 100, that is, in the Y1 direction. The load-exerted portions 40 are, as illustrated in FIGS. 5(b) and 5(c), shaped to be subjected to loads (i.e., mechanical pressure) P to elastically deform the spring 30, thereby shifting the supported portions 20.

Each of the load-exerted portions 40, as illustrated in FIG. 2, has formed therein the cut-out 41 which is made by cutting out a portion of the plate 10. Specifically, the cut-outs 41 are formed in ends 11a and 11b of the plate 10 which are opposed to each other in the lengthwise direction X of the plate 10. Each of the cut-outs 41 has the inner wall 42 which is substantially of a U-shape in a plan view. The maintenance pipe 133 is partially disposed in one of the cut-outs 41. The cut-out 41 is shaped to have a size larger than that of a transverse section of the maintenance pipe 133. The inner wall 42 is placed away from, in other words, in non-contact with the maintenance pipe 133.

The press member 1 is, as can be seen in FIG. 2, of a rectangular strip shape in a plan view. The press member 1 is geometrically symmetrical with respect to a first imaginary straight line L1 defined to pass through the center XO of the length of the press member 1 and extend in the direction Z perpendicular to the lengthwise direction X. The press member 1 is also geometrically symmetrical with respect to a second imaginary straight line L2 defined to pass through the center ZO of the width of the press member 1 and extend parallel to the lengthwise direction X.

How to assemble the press member 1 will be described below with reference to FIGS. 5(a) to 5(d).

Figure 5A:
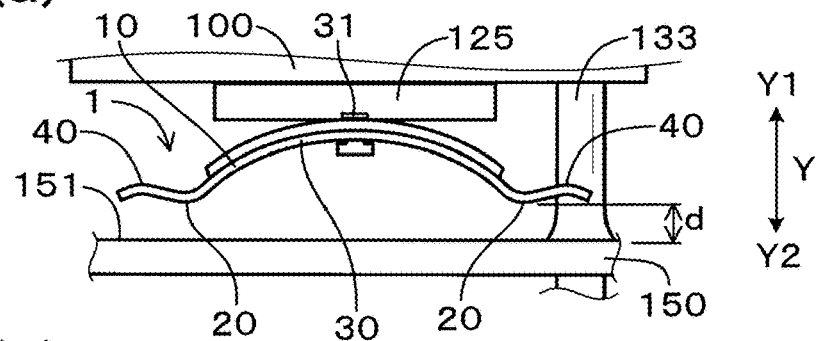
FIGS. 5(a) to 5(d) are schematic views which illustrate how to install a press member in an electrical power conversion device in the first embodiment.
Figure 5B:
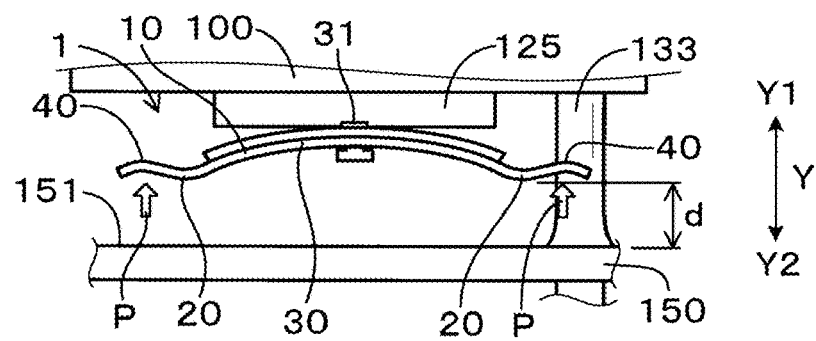
Figure 5C:
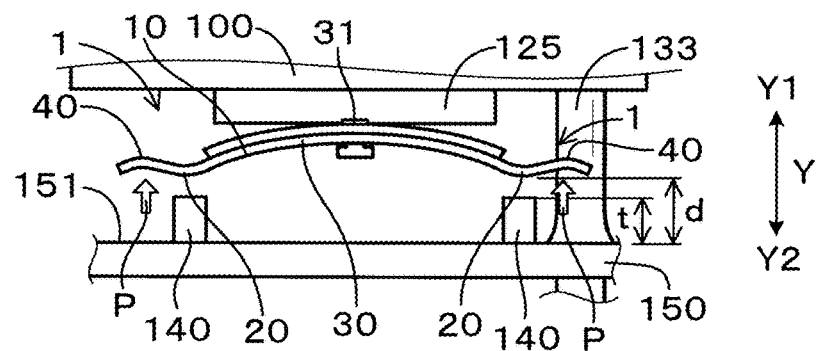

First, the press member 1 is, as demonstrated in FIG. 5(a), lowered from above the drawing in the casing 150 in which the semiconductor stack unit 100 has already been mounted from above the drawing. Specifically, the press member 1 is disposed between the semiconductor stack unit 100 and the inner wall 151 of the casing 150. Next, the press member 1 is moved in the direction X1, as illustrated in FIG. 2, until the maintenance pipe 133 is partially placed in the cut-out 41. In the initial state shown in FIG. 5(a), the interval d between the inner wall 151 of the casing 150 and each of the supported portions 20 in the stacking direction Y is selected, as illustrated in FIG. 5(c), to be smaller than the length t of the supporting members 140 in the stacking direction Y (i.e., a minimum distance between the top end of each of the supporting member 140 and the inner wall 151 of the casing 150). Next, the load P is, as illustrated in FIG. 5(b), applied to the load-exerted portions 40, to elastically deform the spring 30, thereby moving the supported portions 20 toward the semiconductor stack unit 100, that is, in the direction Y1. Specifically, the load P continues to be applied to the load-exerted portions 40 until the interval d between the inner wall 151 of the casing 150 and each of the supported portions 20 illustrated in FIG. 5(b) becomes larger than the length t of the supporting members 140 illustrated in FIG. 5(c).

Figure 5D:
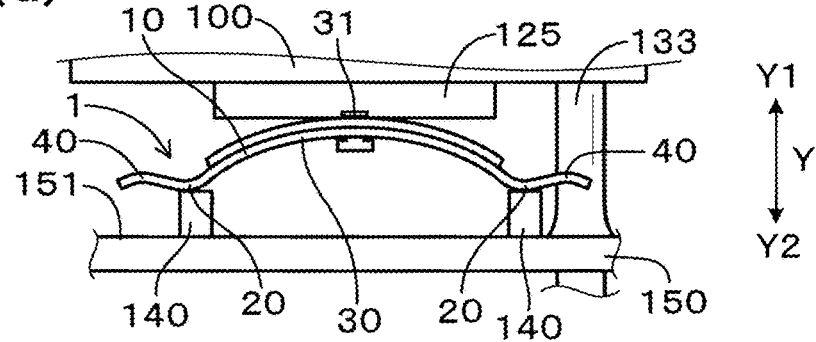

Subsequently, the supporting members 140 are, as illustrated in FIG. 5(c), disposed between the respective supported portions 20 and the inner wall 151 of the casing 150. The load P is then, as illustrated in FIG. 5(d), released from the load-exerted portions 40, thereby causing the spring 30 which has been elastically deformed to be returned to the original state thereof to place the supported portions 20 in contact with the supporting members 140. The reactive force occurring in the spring 30 then works to press the pressure-exerted plate 125 at the contacting portion 31 in the direction Y1, thereby pressing the semiconductor stack unit 100 in the direction Y1.

The press member 1 in this embodiment offers the following beneficial advantages.

The press member 1 is, as described above, designed to have the load-exerted portions 40 located outside the supported portions 20 in the lengthwise direction of the press member 1. Each of the load-exerted portions 40 has the cut-out 41 formed therein. The physical interference of the press member 1 and the maintenance pipe 133 is, therefore, avoided by placing the maintenance pipe 133 which extends from the end of the semiconductor stack unit 100 facing the press member 1 within one of the cut-outs 41. The load-exerted portions 40 are subjected to the load P to elastically deform the spring 30 when the press member 1 is mounted on the semiconductor stack unit 100, after which the load P is released from the load-exerted portions 40, thus eliminating the need for the load-exerted portions 40 to have a higher degree of durability than the spring 30 and the supported portions 20 on which the pressure is always exerted. This enables the load-exerted portions 40 to have the cut-outs 41 without experiencing an excessive reduction in durability. It is, thus, possible to avoid the physical interference between the press member 1 and the maintenance pipe 133 without sacrificing a required elastic deformation or stroke and durability of the press member 1.

The cut-outs 41 are, as described above, formed in the ends 11a and 11b of the plate 10 which are opposed to each other in the lengthwise direction X, thereby requiring the pressure member 1 only to be slightly moved in the lengthwise direction X until the maintenance pipe 133 lies in the cut-out 41 when the press member 1 is installed in the casing 150. This facilitates the ease with which the electrical power conversion device 500 is fabricated.

At least one of the cut-outs 41 is shaped to enable the maintenance pipe 133 that serves as a cooling medium flow path which connects with the semiconductor stack unit 100 and through which the cooling medium flows to be at least partly arranged therein. This achieves use of the press member 1 with the semiconductor stack unit 100 equipped with the maintenance pipe 133.

The supporting members 140 are made to be discrete from the casing 150, but however, may alternatively be formed integrally with the casing 150. For instance, the casing 150 may be shaped to have the inner wall 151 which includes the supporting members 140 and achieves the mechanical contact with the supported portions 20.

Figure 6:
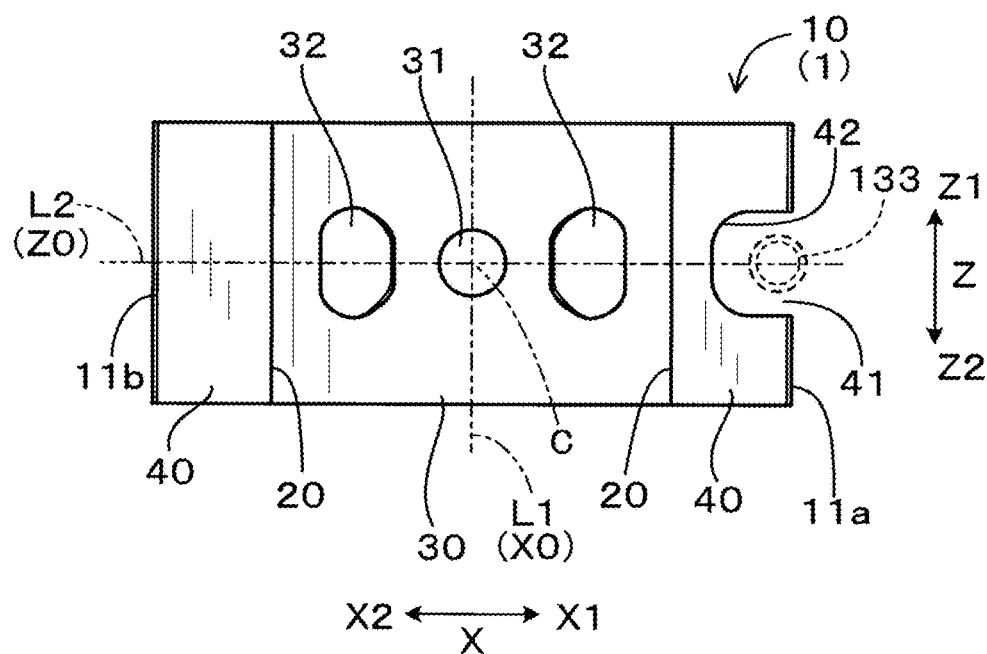
FIG. 6 is a plan view which illustrates a press member in the first modification.

The plate 10 in this embodiment is, as described above, designed to have the cut-outs 41 formed both in the ends 11a and 11b opposed to each other in the lengthwise direction X, but however, may alternatively be, as illustrated as a first modification in FIG. 6, shaped to have the cut-out 41 formed only in the end 11a.

The spring 30 is, as described above, shaped to have the stress concentration reducers 32 formed by cutting out portions of the plate 10 to alleviate the concentration of stress on the spring 30, thereby causing the higher stress region to be widely extended to reduce the concentration of stress on the spring 30. This achieves a required elastic stroke of the press member 1 without decreasing the durability of the press member 1.

The press member 1, as described above, has a configuration symmetrical with respect to the first imaginary straight line L1 defined to pass through the center XO of the length of the press member 1 and extend in the direction Z perpendicular to the lengthwise direction X. The configuration of the press member 1 is also shaped to be symmetrical with respect to the second imaginary straight line L2 defined to pass through the center ZO of the width of the press member 1 and extend parallel to the lengthwise direction X. This results in uniformity of spring load produced by the press member 1, facilitates enhancement of the spring load, and improves the productivity or ease of assembly of the press member 1 in the electrical power conversion device 500.

Figure 7:
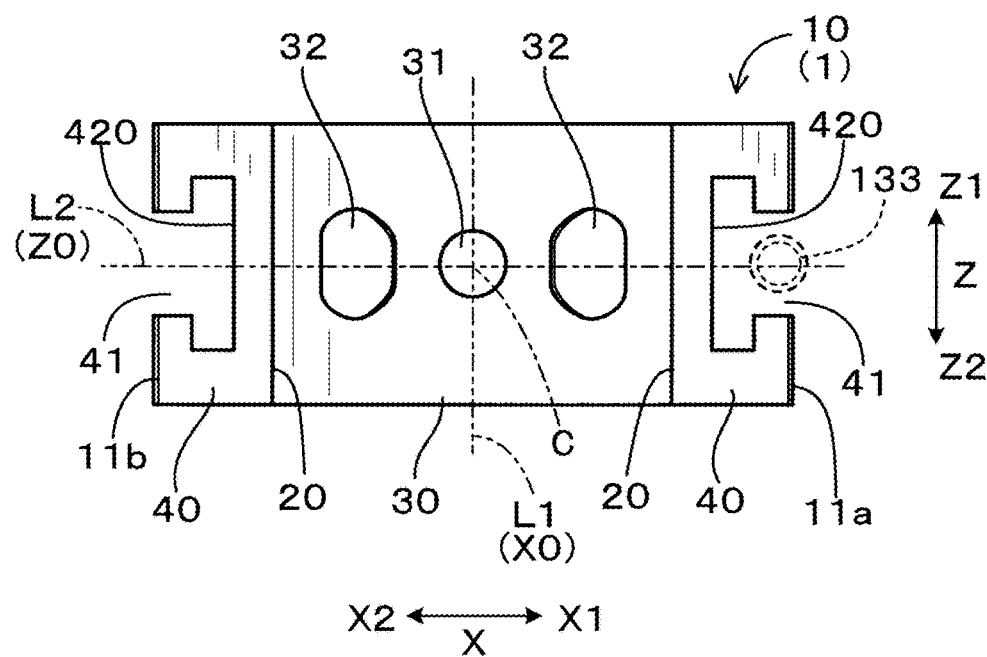
FIG. 7 is a plan view which illustrates a press member in the second modification.

The inner wall 42 of each of the cut-outs 41 of the press member 1 is, as illustrated in FIG. 2, substantially of a U-shape, but however, the press member 1 may alternatively be, as shown in FIG. 7 as a second modification, formed to have the inner wall 420 which is of a C-shape which includes a narrow opening exposed outside the end of the press member 1 and a wider recess extending in the width-wise direction Z of the press member 1. This configuration of the cut-outs 41 enables an interval between the ends 11a and 11b of the plate 10 in the lengthwise direction X to be increased, thereby facilitating the application of load to the load-exerted portions 40 when the press member 10 is fabricated in the electrical power conversion device 500.

Figure 8:
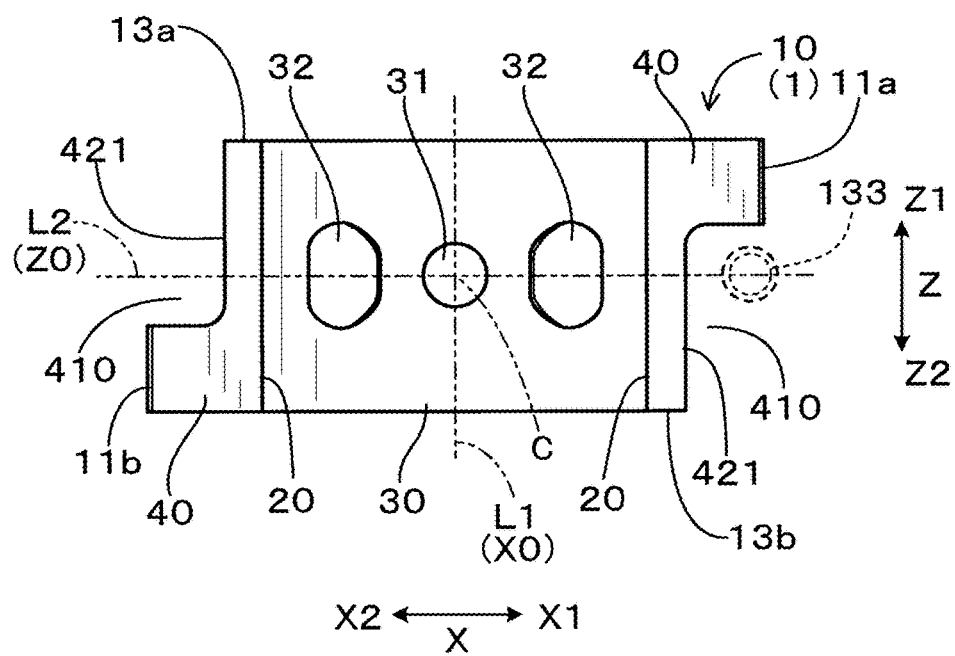
FIG. 8 is a plan view which illustrates a press member in the third modification.
Figure 9:
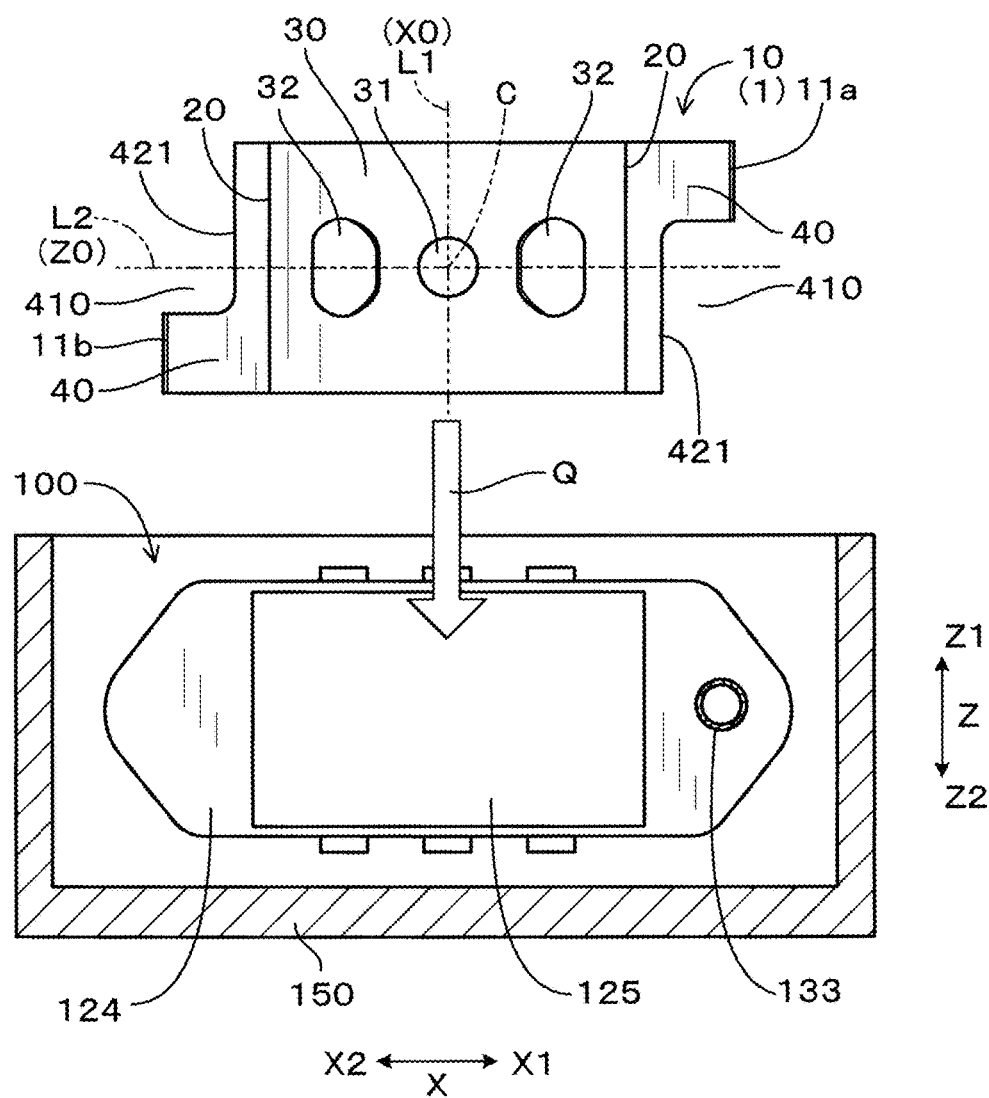
FIG. 9 is a schematic view which demonstrates how to install a press member in an electrical power conversion device in the third modification.

The cut-out 41 are, as illustrated in FIG. 2, formed in the ends 11a and 11b of the length of the plate 10, but however, the plate 10 may alternatively be, as shown in FIG. 8 as a third modification, shaped to have the cut-outs 410 formed in corners of the plate 10. Specifically, the plate 10 has sides 13a and 13b opposed to each other through the width thereof. One of the cut-outs 410 is formed in one of the corners of the plate 10 located at an intersection of the end 11a and the side 13b. The other cut-out 410 is formed in the corner of the plate 10 located at an intersection of the end 11b and the side 13a. The installation of the press member 1 in the electrical power conversion device 500 may be, as illustrated in FIG. 9, achieved only by putting the press member 1 into the casing 150 in a direction Q indicated by an arrow in the drawing, so that the maintenance pipe 133 is, as illustrated in FIG. 8, at least partially disposed in one of the cut-outs 410. This improves the mountability of the press member 1 in the electrical power conversion device 500. The cut-outs 410 in the third modification are formed in the load-exerted portions 40, but not in the supported portions 20 and the spring 30, thus ensuring a required degree of durability of the press member 1.

The press member 1 in the third modification is also shaped to be geometrically point-symmetrical with respect to the center C thereof that is an intersection of the first imaginary straight line L1 and the second imaginary straight line L2. This results in uniformity of spring load produced by the press member 1 and facilitates enhancement of the spring load. The configuration of the press member 1 enables the press member 1 to be mounted in the electrical power conversion device 500 with the press member 1 rotated 180 degrees around the center C. This facilitates the mountablity of the press member 1 in the electrical power conversion device 500.

Figure 10:
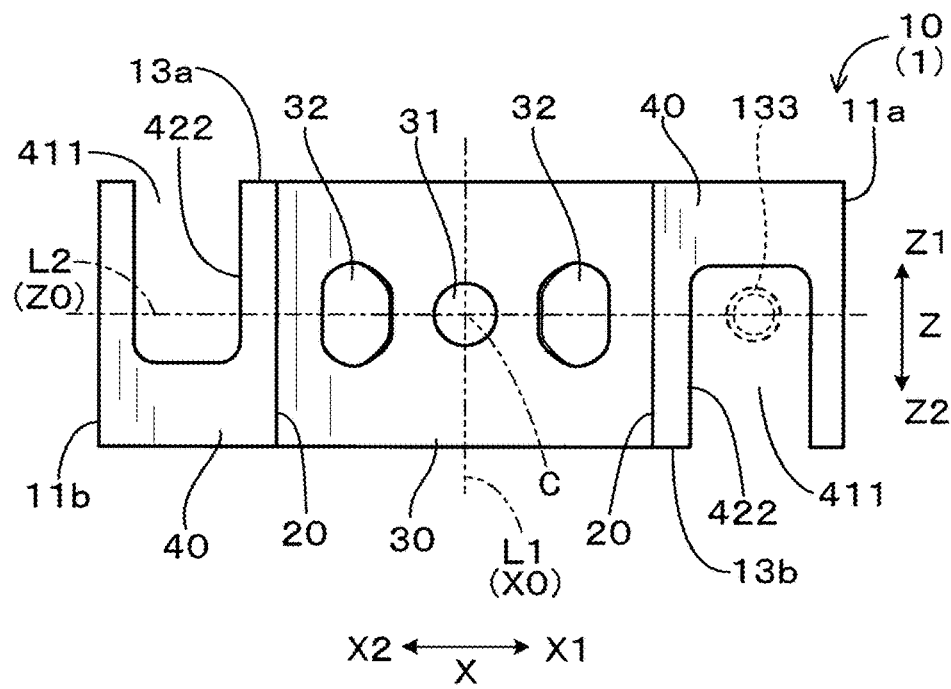
FIG. 10 is a plan view which illustrates a press member in the fourth modification.

The third modification has the cut-outs 410 formed in the corners of the plate 10, but however, may alternatively be, as illustrated in FIG. 10, engineered as a fourth modification to have the cut-outs 411 formed in portions of the sides 13a and 13b opposed to each other in the width-wise direction Z of the plate 10. The cut-outs 411 are shaped to have a size large enough to have the maintenance pipe 133 disposed therein. Each of the cut-outs 411 has the inner wall placed away from the periphery of the maintenance pipe 133. The fourth modification offers substantially the same beneficial advantages as those in the third modification. The fourth modification has the load-exerted portions 4 larger in size than in the third modification, thereby facilitating the application of load to the load-exerted portions 40 when the press member 1 is fabricated in the electrical power conversion device 500, thereby further improving the mountability of the press member 1 in the electrical power conversion device 500.

Figure 11:
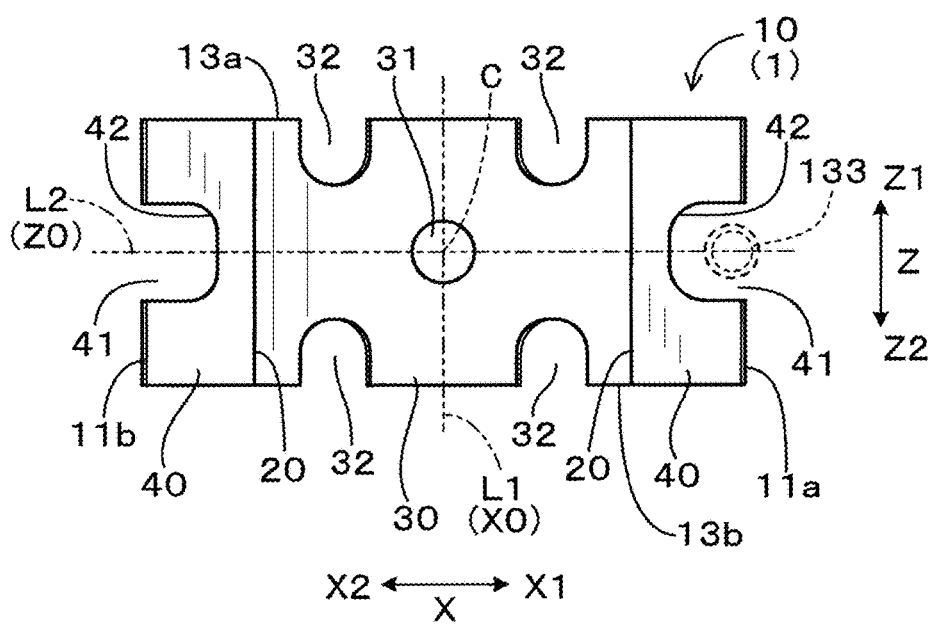
FIG. 11 is a plan view which illustrates a press member in the fifth modification.

The first embodiment is, as illustrated in FIG. 2, equipped with the stress concentration reducers 32 formed by through-holes in the spring 30, but however, each of the stress concentration reducers 32 may alternatively be, as illustrated in FIG. 11 as a fifth modification, made by U-shaped cut-outs formed by cutting away portions of the sides 13a and 13b of the plate 10. The size and/or location of each of the stress concentration reducers 32 may be selected to create a required degree of durability of the spring 30. The fifth modification also offers substantially the same beneficial advantages as those in the first embodiment.

Figure 4A:
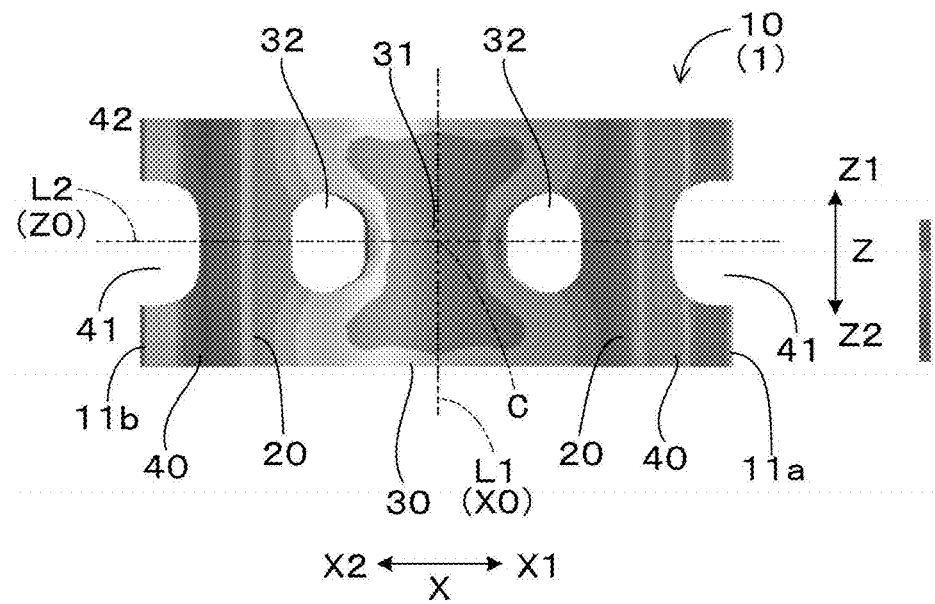
FIG. 4(a) is a top view which illustrates distribution of stress on a press member in the first embodiment.
Figure 4B:
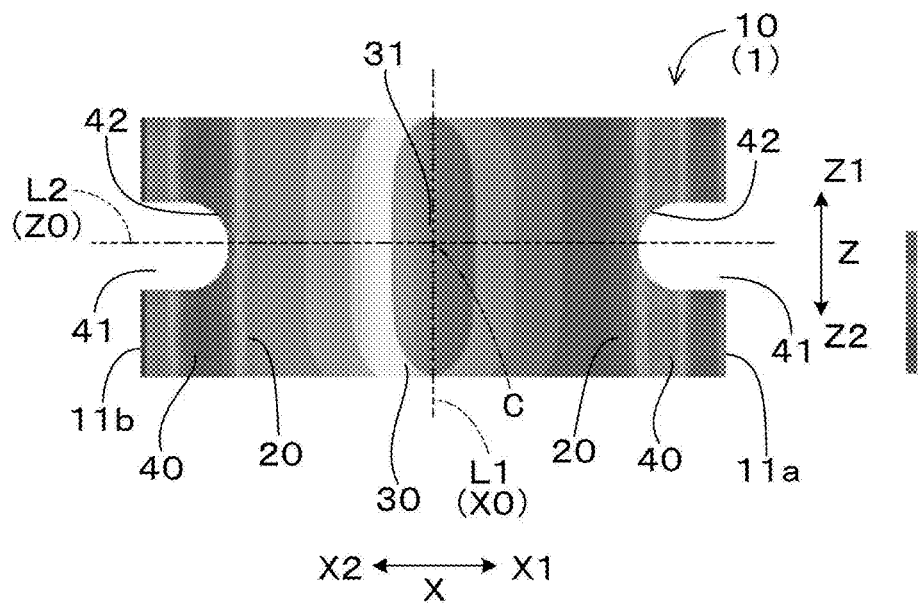
FIG. 4(b) is a top view which illustrates distribution of stress on a press member in the sixth modification.

The spring 30 of the first embodiment is, as illustrated in FIG. 2, equipped with the stress concentration reducers 32, but however, may alternatively be, as illustrated in FIG. 4(b) as a sixth modification, designed not to have the stress concentration reducers 32. The sixth modification offers substantially the same beneficial advantages as those in the first embodiment except for the stress concentration reducers 32.

The press member 1 in the first embodiment and the modifications is used to press the semiconductor stack unit 100 and capable of eliminating the physical interference with peripheral members and achieving a required amount of stroke and durability thereof.

Second Embodiment

Figure 12:
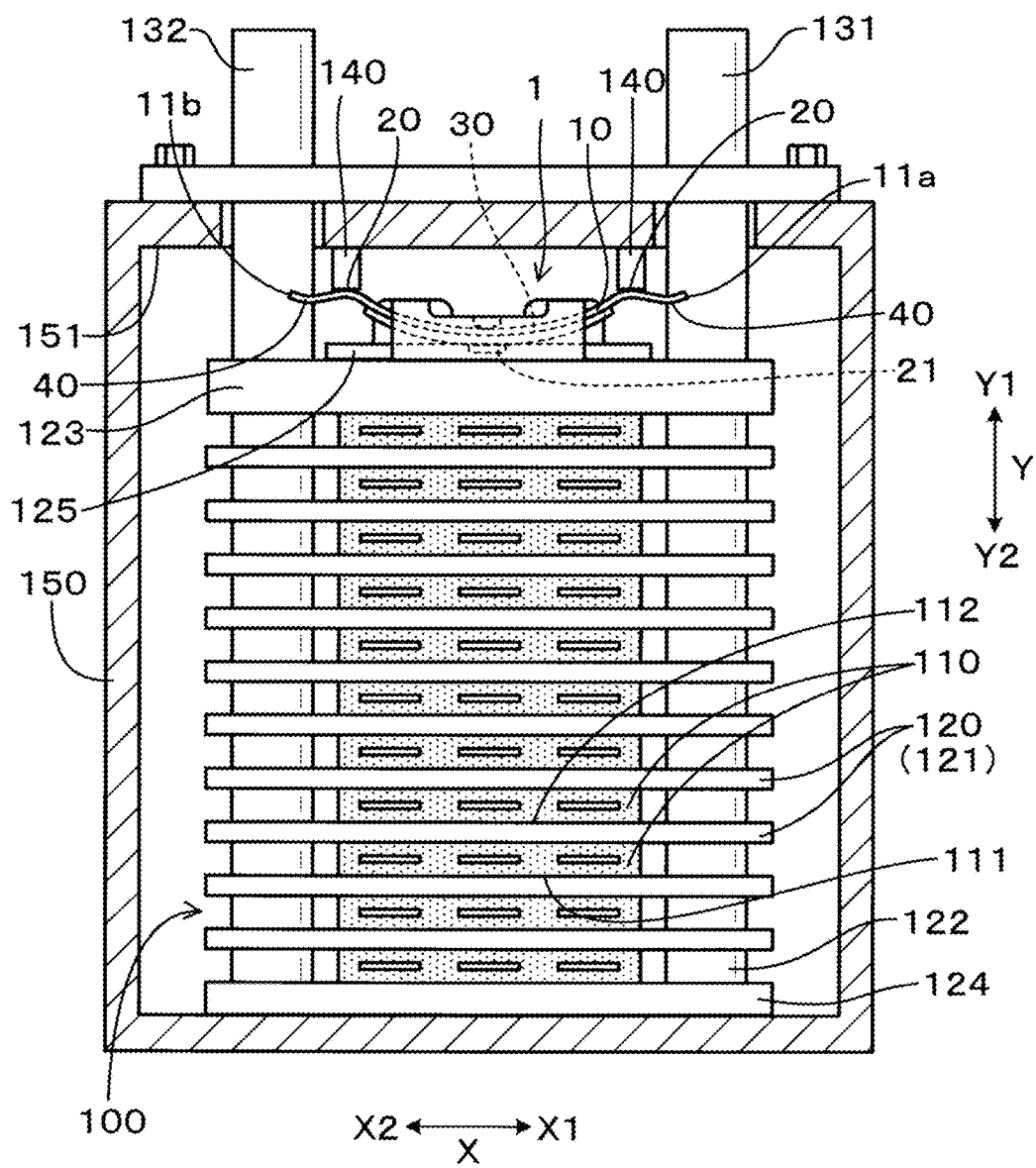
FIG. 12 is a schematic plan view which illustrates an electrical power conversion device according to the second embodiment.

The semiconductor stack unit 100 has the first end (i.e., the lower end, as viewed in FIG. 1) and the second end (i.e., the upper end, as viewed in FIG. 1) opposed to the first end in the stacking direction Y. The press member 1 in the first embodiment is, as can be seen from FIG. 1, mounted on the first end of the semiconductor stack unit 100 which is opposite the second end in the stacking direction Y where the cooling medium inlet pipe 131 and the cooling medium outlet pipe 132 are installed, while the press member 1 in the second embodiment may be, as illustrated in FIG. 12, disposed on the second end of the semiconductor stack unit 100. The pressure-exerted plate 125 is mounted on the cooling pipe 123 which forms the second end of the semiconductor stack unit 100. Specifically, the press member 1 is arranged on the pressure-exerted plate 125 with the contacting portion 31 placed in direct contact with the pressure-exerted plate 125, thereby pressing the semiconductor stack unit 100 in the second direction Y2.

Figure 13:
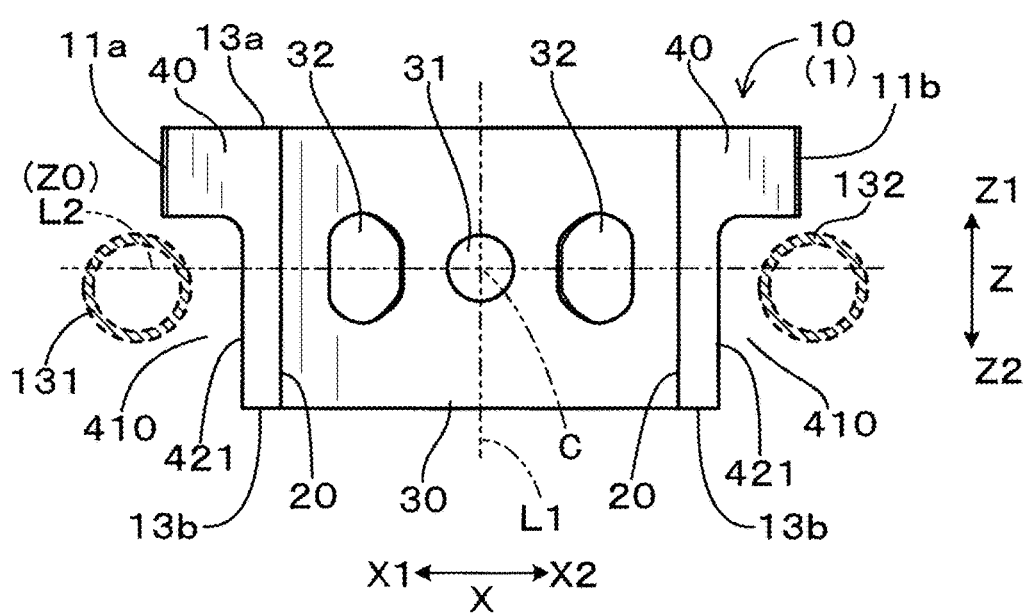
FIG. 13 is a plan view which illustrates a press member in the second embodiment.

The press member 1 is, as illustrated in FIG. 13, shaped to have two cut-outs 410: one formed in a corner of the plate 10 which is an intersection of the end 11a and the side 13b of the plate 10, and the second formed in a corner of the plate 10 which is an intersection of the end 11b and the side 13b. The press member 1 is shaped to be geometrically symmetrical with respect to the first imaginary straight line L1. When the press member 1 is mounted on the semiconductor stack unit 100, the cooling medium inlet pipe 131 is partially disposed in one of the cut-outs 410 which faces the direction X2, while the cooling medium outlet pipe 132 is partially disposed in other cut-out 410 facing the direction X1. Other arrangements are identical with those in the first embodiment. The same reference numbers as employed in the first embodiment refer to the same parts, and explanation thereof in detail is omitted here.

Figure 14:
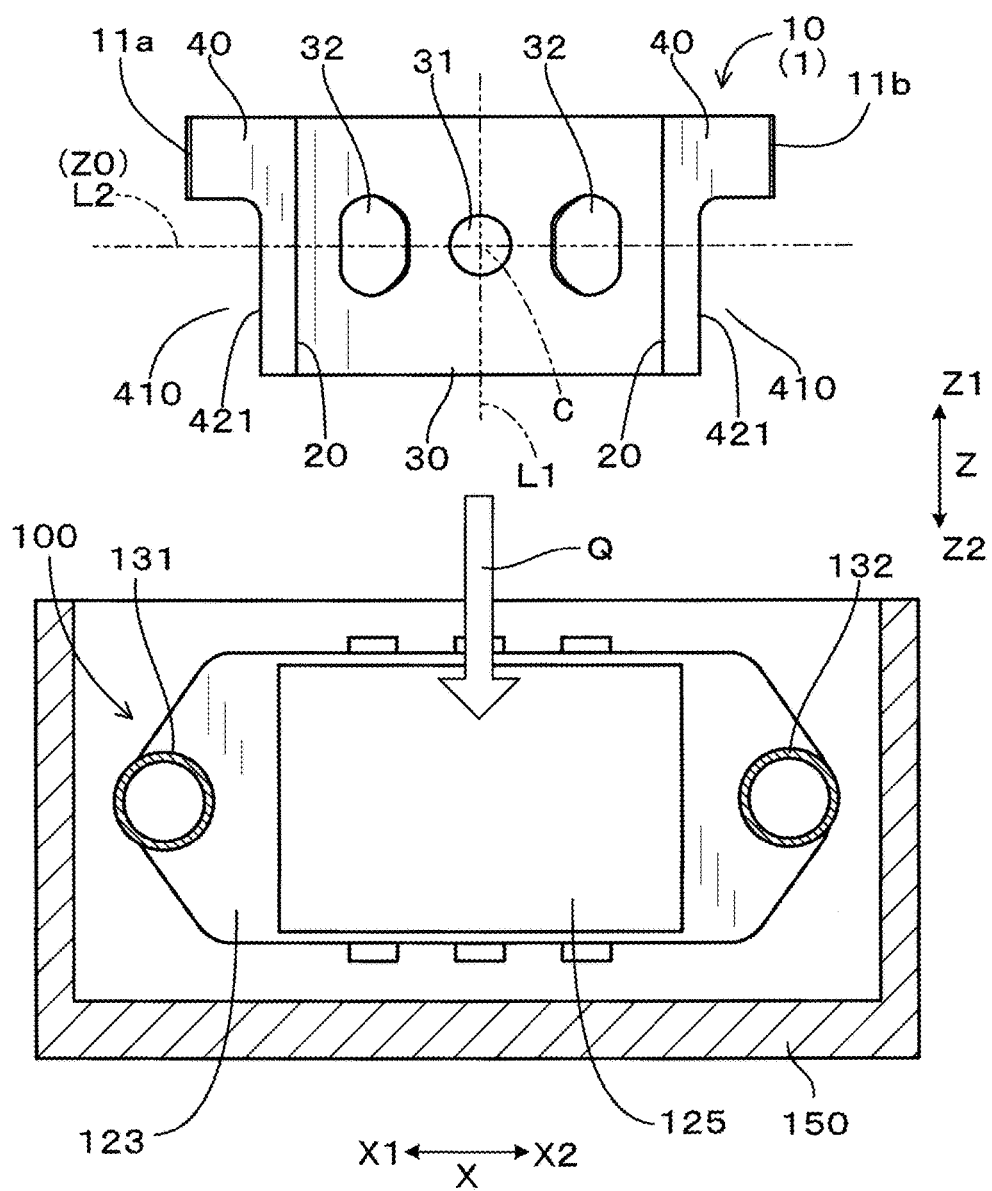
FIG. 14 is a schematic view which demonstrates how to install a press member in an electrical power conversion device in the second embodiment.

The installation of the press member 1 in the electrical power conversion device 500 may be, as illustrated in FIG. 14, achieved, like in the third modification, only by putting the press member 1 into the casing 150 in the direction Q indicated by an arrow in the drawing, so that the cooling medium inlet pipe 131 and the cooling medium outlet pipe 132 are, as illustrated in FIG. 13, partially placed in the cut-outs 410. This improves the mountability of the press member 1 in the electrical power conversion device 500. The cut-outs 410 are formed in the load-exerted portions 40, but not the supported portions 20 and the spring 30, thus ensuring a required degree of durability of the press member 1. The second embodiment offers substantially the same beneficial advantages as those in the first embodiment except those provided by the point-symmetry of the press member 1 in the first embodiment.

While the present invention has been disclosed in terms of the preferred embodiments in order to facilitate better understanding thereof, it should be appreciated that the invention can be embodied in various ways without departing from the principle of the invention. Therefore, the invention should be understood to include all possible embodiments and modifications to the shown embodiments which can be embodied without departing from the principle of the invention as set forth in the appended claims. For instance, the stress concentration reducers 32 in the second embodiment may alternatively be implemented by, like in the fifth modification, cut-outs formed by cutting away portions of the sides 13a and 13b of the plate 10.

What is claimed is:

1. A press member which is made of a plate having a given length for pressing a semiconductor stack unit in which a plurality of semiconductor modules and a plurality of cooling medium flow paths are stacked in a stacking direction, the cooling medium flow paths serving to cool the semiconductor modules, comprising:
   a pair of supported portions with which supporting members are placed in contact and which are arranged in a lengthwise direction of the plate;
   a spring which is curved in a convex shape and bulges away from contacts of the supporting members with the supported portions, the spring being in contact with a first end that is one of ends of the semiconductor stack unit opposed to each other in the stacking direction; and
   a pair of load-exerted portions which are arranged outside the supported portions in the lengthwise direction of the plate and capable of being subjected to mechanical load to elastically deform the spring, thereby shifting the supported portions,
   wherein at least one of the load-exerted portions has a cut-out formed by cutting away a portion of the plate.

2. A press member as set forth in claim 1, wherein the cut-out is formed in at least one of ends of a length of the plate.

3. A press member as set forth in claim 1, wherein the cut-out is formed in a corner of the plate.

4. A press member as set forth in claim 1, wherein the cut-out is configured to have a cooling medium flow path at least partly disposed therein, the cooling medium flow path connecting with the semiconductor stack unit and having a cooling medium flowing therein.

5. A press member as set forth in claim 1, wherein the spring is equipped with a stress concentration reducer which is provided by a cut-out formed in a portion of the plate and serves to alleviate concentration of stress on the spring.

6. A press member as set forth in claim 1, wherein the press member is geometrically symmetrical with respect to a first imaginary straight line defined to pass through the center of a length of the press member and extend in a direction perpendicular to the lengthwise direction of the plate, and wherein the press member is also geometrically symmetrical with respect to a second imaginary straight line defined to pass through the center of a width of the press member and extend parallel to the lengthwise direction of the plate.

7. A press member as set forth in claim 1, wherein the press member is shaped to be point-symmetrical with respect to a center of the plate.

* * * * *